United States Patent
Fitz et al.

(10) Patent No.: US 7,442,577 B1
(45) Date of Patent: Oct. 28, 2008

(54) METHOD OF FABRICATING A PATTERNED DEVICE USING SACRIFICIAL SPACER LAYER

(75) Inventors: John Leslie Fitz, Baltimore, MD (US); Harris Turk, Baltimore, MD (US)

(73) Assignee: United States of America as represented by the Director, National Security Agency The United, Washington, DC (US)

( * ) Notice: Subject to any disclaimer, the term of this patent is extended or adjusted under 35 U.S.C. 154(b) by 340 days.

(21) Appl. No.: 11/357,459

(22) Filed: Feb. 14, 2006

(51) Int. Cl.
*H01L 21/50* (2006.01)
*H01L 21/48* (2006.01)
*H01L 21/44* (2006.01)

(52) U.S. Cl. ............... 438/106; 438/107; 438/115

(58) Field of Classification Search ............. 438/106, 438/107, 115
See application file for complete search history.

(56) References Cited

U.S. PATENT DOCUMENTS

| | | | |
|---|---|---|---|
| 6,071,805 A | 6/2000 | Liu | |
| 6,486,025 B1 | 11/2002 | Liu et al. | |
| 6,900,072 B2 * | 5/2005 | Patel et al. | 438/106 |
| 6,915,054 B2 | 7/2005 | Wong | |
| 6,917,109 B2 | 7/2005 | Lur et al. | |
| 7,112,526 B2 * | 9/2006 | Okada | 438/622 |
| 2001/0035558 A1 | 11/2001 | Smith et al. | |
| 2005/0176228 A1 | 8/2005 | Fonash et al. | |

OTHER PUBLICATIONS

Wan Thai Hsu et al., "A Sub-Micron Capacitive Gap Process for Multiple-Metal-Electrode Lateral Micromechanical Resonators", Technical Digest, 14th International IEEE Micro Electro Mechanical Conference, Jan. 2001.
S. Rennon et al., "12μm long edge-emitting quantum-dot laser", Electronics Letters, May 2001.
Shoji Akiyama et al., "Air Trench Bends and Splitters for Dense Optical Integration in Low Index Contrast", Journal of Lightwave Technology, Jul. 2005.
Wook Jun Nam et al., "Fabrication and evaluation of highly manufacturable nanoscale flow-through parallel electrode structures", Journal Vac. Sci. Technol. B 22(6), Nov./Dec. 2004, pp. L35-L37, American Vacuum Society.
Mandar M. Deshmukh, et al., "Nanofabrication using a stencil mask", Applied Physics Letters, Sep. 13, 1999, pp. 1631-1633, Vol. 75, No. 11, American Institute of Physics.

* cited by examiner

*Primary Examiner*—Luan Thai
(74) *Attorney, Agent, or Firm*—Jennifer P. Ferragut

(57) ABSTRACT

The present invention is a method of fabricating a patterned device using a sacrificial spacer layer. The first step in this process is to select an appropriate substrate and form a step thereon. The sacrificial layer is then applied to the substrate and a blocking layer is deposited on the sacrificial layer. The blocking layer is etched back to define the mask for the semiconductor structure and the sacrificial layer is removed. The substrate is then etched using the gap created by removal of the sacrificial layer.

7 Claims, 3 Drawing Sheets

METHOD OF FABRICATING A PATTERNED DEVICE USING SACRIFICIAL SPACER LAYER

FIELD OF THE INVENTION

The present invention relates to a semiconductor manufacturing process and, more specifically to a semiconductor manufacturing process for making a device including an air-gap.

BACKGROUND OF THE PRESENT INVENTION

Integration of semiconductor lasers to planar optical components, such as waveguides, semiconductor optical amplifiers (SOAs) and detectors, is important for integrated circuit applications. When working with photonic integrated circuits it is essential to control reflections from the interfaces between integrated photonic components. With proper design, interface reflections may be used to enhance performance of integrated lasers.

One method is to precisely space gaps between components to coherently enhance or reduce reflections from the interfaces. Prior art methods describe the use of resonant and anti-resonant etched gaps used to couple between lasers, SOAs and other lasers, taking advantage of the index discontinuity across air gaps to selectively enhance or reduce reflections across interfaces. A similar process has been demonstrated to create semiconductor lasers that make use of etched gaps in the semiconductor material to enhance reflectivity of the laser mirrors. At near-infrared wavelengths, electron beam lithography is frequently required to provide the necessary resolution to define the etch masks used to create the resonant gaps.

"A Sub-Micron Capacitive Gap Process for Multiple-Metal-Electrode Lateral Micromechanical Resonators," Wan That Hsu, et al, *Technical Digest*, 14$^{th}$ International IEEE Micro Electro Mechanical Conference, January 2001, discloses a process for fabricating a semiconductor having gaps between metal electrodes and a polysilicon resonator resident on the semiconductor. With this method, a sacrificial spacer layer is deposited on a substrate. A polysilicon resonator is then deposited and etched over the sacrificial layer, during which time portions of the sacrificial layer are removed, and the metal electrodes are formed through electroplating on either side of the resonator. The sacrificial layer is ultimately removed in its entirety. The present invention does not operate in the same manner as this process. The Hsu article is hereby incorporated by reference into the present invention.

"12 µm long edge-emitting quantum-dot laser," S. Rennon, et al, *Electronics Letters*, May 2001, discloses a series of mirrors and a central waveguide. Each of the mirrors and the central waveguide are etched. Bragg mirrors are patterned by electron-beam lithography on the rear side of the waveguide with air gaps etched between the Bragg gratings. First order mirrors are etched on the front side of the waveguide. The air gaps between Bragg mirrors decrease reflection loss in the laser produced by this method. The present invention is not fabricated in the same manner as the invention of Rennon, et al. Rennon, et al is hereby incorporated by reference into the specification of the present invention.

"Air Trench Bends and Splitters for Dense Optical Integration in Low Index Contrast," Shoji Akiyama, et al, *Journal of Lightwave Technology*, July 2005, discloses air trench waveguides, and specifically air trench bend structures. It specifically describes a process for creating a waveguide with air trenches by first patterning the waveguide through a dry etching process and thereafter patterning the air trenches through a photolithography and dry etching process. The process of the present invention does not operate in this manner. Akiyama, et al is hereby incorporated by reference into the specification of the present invention.

U.S. Pat. No. 6,917,109, entitled "AIR GAP STRUCTURE AND FORMATION METHOD FOR REDUCING UNDESIRED CAPACITIVE COUPLING BETWEEN INTERCONNECTS IN AN INTEGRATED CIRCUIT DEVICE," discloses a method for creating air gaps in integrated circuits between patterned interconnect structures. In the method of the invention, interconnect structures are patterned on a semiconductor device with trenches being etched between the interconnect structures. A dielectric layer is then patterned over the device and air gaps are formed in the dielectric layer. The present invention does not operate in the same method as the patent. U.S. Pat. No. 6,917,109 is hereby incorporated by reference into the specification of the present invention.

U.S. Pat. No. 6,915,054, entitled "METHODS FOR PRODUCING WAVEGUIDES," discloses a method for producing waveguides using a sacrificial layer. A waveguide is produced by first depositing a metal layer on a substrate. A sacrificial layer is then deposited over the metal layer and a second metal layer is deposited over the sacrificial layer and contacts the first metal layer. The second metal layer defines a cavity between the first and second layer, the cavity being filled with the sacrificial layer. The sacrificial layer is thereafter removed. The present invention does not operate in the same manner as the method of the patent. U.S. Pat. No. 6,915,054 is hereby incorporated by reference into the present invention.

U.S. patent application Ser. No. 09/412,682, entitled "SACRIFICAL SPACER FOR INTEGRATED CIRCUIT TRANSISTORS," discloses a semiconductor integrated circuit with a sacrificial sidewall. Specifically, temporary sidewalls are formed along the side of a gate electrode of a semiconductor. Source/drain regions are then formed on the semiconductor alongside the gate electrode, and the temporary sidewalls are removed, resulting in a space between the gate electrode and the source/drain regions. The present invention does not operate in this manner. U.S. patent application Ser. No. 09/412,682 is hereby incorporated by reference into the specification of the present invention.

U.S. Pat. No. 6,286,025, entitled "METHODS FOR FORMING MEMORY CELL STRUCTURES," discloses two methods for forming memory cell structures in a semiconductor integrated circuit. One method includes the use of a sacrificial spacer layer formed adjacent to the sidewall of a capacitor of a field effect transistor formed on the semiconductor device. A dielectric layer is then formed alongside the spacer layer, through which a bitline stud layer is formed that is electrically connected to the source/drain regions of the field effect transistor. The sacrificial spacer layer is finally removed from the structure. The present invention operates in a different manner from this process. U.S. Pat. No. 6,486,025 is hereby incorporated by reference into the specification of the present invention.

U.S. Pat. No. 6,071,805, entitled "AIR GAP FORMATION FOR HIGH SPEED IC PROCESSING," discloses a method of using a filler material during conventional Damascene processing to form air gaps. After initial construction of the base device, trenches are etched to form metal leads. The trenches are filled with a filler material. A silicon oxide layer is deposited over the metal leads and filler material and vent holes are etched in the silicon oxide material such that each area of filler material is accessed by a vent hole. The filler material is then removed to form air gaps and the final intermetal oxide layer is deposited on the silicon oxide layer. The present invention does not operate in the same manner as this invention. U.S. Pat. No. 6,071,805 is hereby incorporated by reference into the specification of the present invention.

The methods described above effectively create air gaps and other spaces in semiconductor structures, however the processes are extremely inefficient as applied to optical devices. If it is desirable to create a precise gap structure, such as an air gap or trench, it is common for several processing steps to be used to form both the component and the accompanying gap. This can be both time-consuming and costly. What is desirable in the art is to create an efficient, inexpensive method of creating optical semiconductor devices with integrated gaps.

SUMMARY OF THE INVENTION

It is an object of the present invention to provide a method of fabricating a precision gap through which additional processing may be performed using a sacrificial spacer layer.

It is a further object of the present invention to provide a method of fabricating an optical device using a sacrificial spacer layer, wherein a single sacrificial spacer layer operates to create a trench.

It is another object of the present invention to provide a method of fabricating an optical device using a sacrificial spacer layer, wherein a single sacrificial spacer layer operates to create a trench and wherein a wet etch is used to remove the sacrificial spacer layer.

The present invention is a method of fabricating an optical device using a sacrificial spacer layer. The first step of the method is selecting a substrate that is resistant to removal by at least one agent.

The second step of the method is forming at least one step on the substrate, wherein the step is resistant to removal by at least one of the same agents as the substrate.

The third step of the method is depositing a sacrificial layer along the step and the substrate, the sacrificial layer being removable by an agent to which the step and the substrate is resistant.

The fourth step is depositing a blocking layer on the sacrificial layer that is resistant to removal by the same agent as the substrate and the step.

The fifth step of the method is removing a user-definable portion of the blocking layer such that the surface of the sacrificial layer is exposed that is between the blocking layer and the step, wherein a portion of the blocking layer remains such that no gap exists between the blocking layer and the sacrificial layer and the remaining blocking layer is adhered to the substrate.

The sixth step of the method is removing the sacrificial layer, wherein a portion of the sacrificial layer remains such that the remaining blocking layer is adhered to the substrate and a gap is created between the remaining blocking layer and the at least one step.

The seventh step of the method is etching the substrate beneath the gap created between the remaining blocking layer and the step adhered to the substrate.

DETAILED DESCRIPTION OF THE PREFERRED EMBODIMENT

Figure 1:
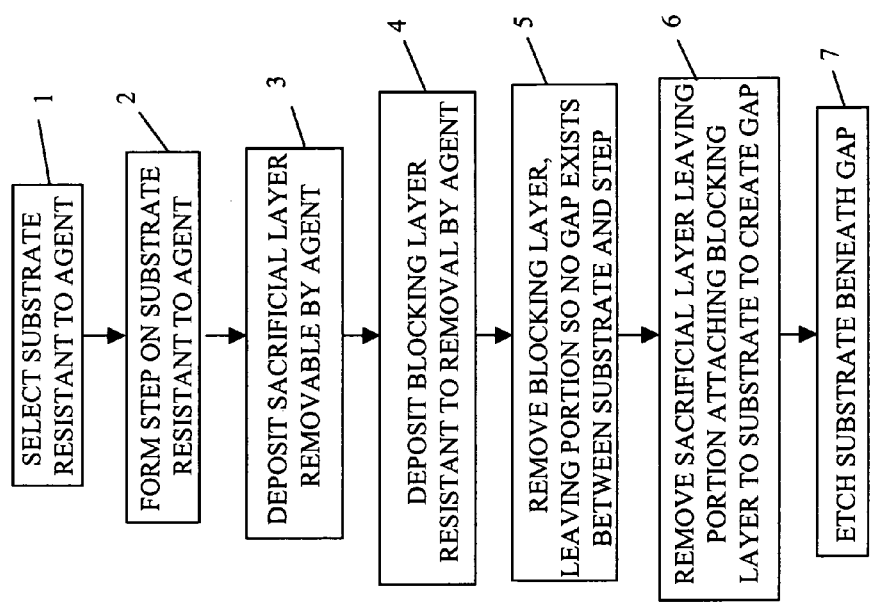
FIG. 1 is a flow chart of the steps of the present invention.

The present invention is a method of fabricating a precision gap through which additional processing may be performed using a sacrificial spacer layer. FIG. 1 shows the steps of the method of the present invention. The first step 1 of the method is selecting a substrate that is resistant to removal by at least one removal agent. The substrate may be composed of any conventional semiconductor, metal or dielectric material, such as a compound semiconductor material, and forms the base of a device fabricated according to the method of the present invention. In a preferred embodiment the substrate is composed of benzocyclobutene (BCB). In an alternative embodiment, the substrate consists of semiconductor material. As is known in the art, there are many methods for removing materials during semiconductor processing, such as the use of etchants, and the substrate must be resistant to at least one agent that would be used for this purpose.

The second step 2 of the method is forming at least one step on the substrate, wherein the step or steps and the substrate are resistant to removal by at least one of the same agents. The step can be created by any conventional method, such as etching into the substrate or depositing material on the substrate to form the step. As is obvious, a step is a raised area of material on the substrate, substantially in the form of a rectangular prism in the preferred embodiment. If multiple steps are used the steps are preferably stacked and offset such that the edges of the steps do not overlap, each ascending step therefore being smaller than each descending step. However any other configuration of steps may be used according to user preferences. As was discussed before, materials used during semiconductor processing are removed through a variety of processes, and the step or steps and the substrate must share resistance to at least one method of removal. If the one or more steps are etched this characteristic will be inherent, however if the one or more steps are deposited the material composing the step or steps must be chosen to ensure that the substrate and step or steps have a common removal agent to which they are resistant. For example if BCB is used as the substrate the steps may be composed of Chromium-Gold (Cr—Au) as the two materials share a common resistance to a buffered oxide etch.

The third step 3 of the method is depositing a sacrificial layer along the at least one step and the substrate, the sacrificial layer being removable by the agent to which the at least one step and the substrate are resistant. The sacrificial layer is preferably composed of an oxide material, however it must be composed of a material that can be removed by the agent to which the at least one step and the substrate are resistant. In a further embodiment the sacrificial layer is composed of $SiO_2$. The sacrificial layer is of a user definable thickness, but in a preferred embodiment is preferably below the resolution readily attainable by standard photolithography. The sacrificial layer can be deposited on the structure by any conventional means, but is preferably deposited using a conformal process.

The fourth step 4 of the method is depositing a blocking layer on the sacrificial layer that is resistant to removal by the same agent as the substrate and at least one step. The blocking layer is a layer of material that coats the entire structure to form a smooth, planar upper surface of the structure. This material may be any suitable semiconductor material, metal or other material that is resistant to the same removal agent as the substrate and at least one step, but is preferably a polymer material. In a preferred embodiment the blocking layer is composed of BCB.

The fifth step 5 of the method is removing a user-definable portion of the blocking layer such that the sacrificial layer is exposed that is between the at least one step and the blocking layer. In the preferred embodiment, a sufficient amount of the blocking layer is removed to reveal the sacrificial layer deposited on the upper surface of each step. The portion of the blocking layer removed should not allow a gap to form between the portion of the sacrificial layer between the blocking layer and the section including the at least one step and the blocking layer. The final blocking layer is preferably of a uniform thickness. In an alternative embodiment several blocking layers may remain each layer having a uniform thickness. These layers may be on each side of a step, or on each side of multiple steps if more than one step exists in the structure.

The sixth step 6 of the method is removing a user-definable portion of the sacrificial layer. In the preferred embodiment some of the sacrificial layer will remain after the sixth step of the method. This remaining sacrificial layer will adhere the remaining blocking layer to the substrate. The remaining sacrificial layer can also act as a mask in further processing steps performed on the substrate. Removal of the sacrificial layer can be performed by any conventional means, but in a preferred embodiment is performed by way of a timed acid etch, or more specifically a timed buffered oxide etch. The result of the removal is that a gap now exists between the blocking layer and the at least one step. In the event multiple steps exist, the removal of the user-definable portion of the sacrificial layer will preferably remove at least one remaining blocking layer that is adhered to a top surface of a step by the sacrificial layer. This is accomplished because the sacrificial layer adhering the blocking layer to the step is removed, thereby resulting in the release of the blocking layer. Take for example a two step structure. A blocking layer remains on the top step and on the portion of the bottom step that is accessible beneath the top step in the staggered arrangement previously described. After the removal process, a portion of the sacrificial layer adhering the blocking layer to the top step may remain, therefore leaving the blocking layer to the top step, but the entire sacrificial layer adhering the blocking layer to the intermediate step is removed, thus removing the blocking layer adhered to the intermediate step. The blocking layer adhered to the substrate also remains as previously described. This allows further processing of the remaining blocking layers and the intermediate step.

The seventh step 7 of the method is etching the substrate beneath the gap created between the remaining blocking layer and at least one of the steps adhered to the substrate. As was discussed above, a user-definable portion of the sacrificial layer is removed with the remaining sacrificial layer adhering a portion of the remaining blocking layer to the substrate. The removal of the sacrificial layer creates a gap between the remaining blocking layer adhered to the substrate and the sidewall of the step abutting the substrate. The substrate is etched through this gap using conventional means, such as the use of an $SF_6/O_2$ plasma etch. as described above. The resulting structure can be useful for many applications, such as the creation of Bragg gratings. In an alternative embodiment material is deposited in the gap described above. This material can serve many purposes, as would be obvious to those of skill in the art. For example, suitable material can be deposited to form a quantum wire on the substrate. Alternatively material can be deposited to form a mask to allow further etching of the substrate. Thereafter, subsequent steps can be performed to remove some or all of the blocking layer and the remaining portion of the at least one step revealing the underlying substrate. The material then can act as a mask layer in further processing of the substrate through conventional methods.

Figure 2:
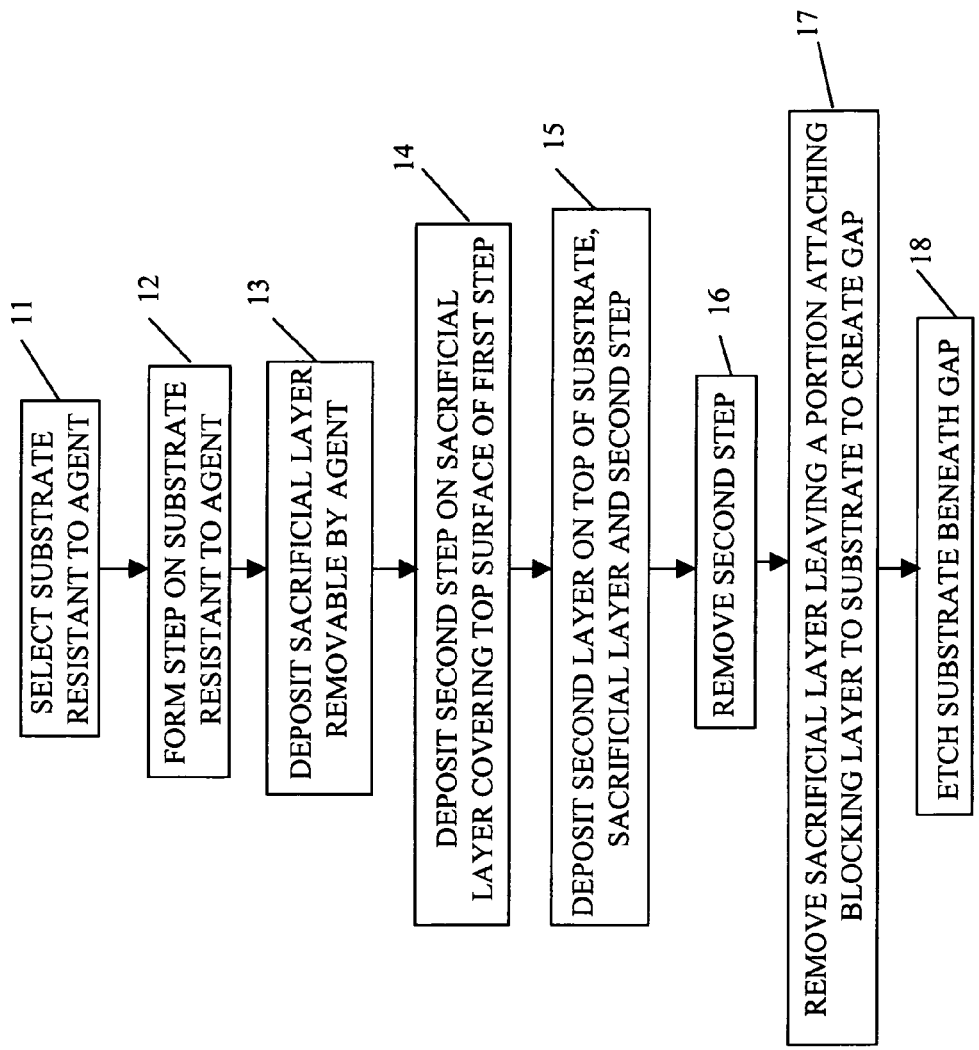
FIG. 2 is a flow chart of the steps of an alternative embodiment of the present invention.

FIG. 2 shows the steps of an alternative embodiment of the present invention. The first step 11 of the alternative embodiment is selecting a substrate that is resistant to removal by at least one removal agent. The substrate may be composed of any conventional semiconductor or dielectric material, such as a compound semiconductor material, and forms the base of the optical device fabricated according to the method of the present invention. In a preferred embodiment the substrate is composed of benzocyclobutene (BCB). In an alternative embodiment, the substrate consists of semiconductor material. As is known in the art, there are many methods for removing materials during semiconductor processing, such as the use of etchants, and the substrate must be resistant to at least one agent that would be used for this purpose.

The second step 12 of the alternative embodiment is forming a first step on the substrate, wherein the first step and the substrate are resistant to removal by at least one of the same agents. The first step can be created by any conventional method, such as etching into the substrate or depositing material on the substrate to form the first step. The first step is substantially identical to that described with respect to the second step 2 of FIG. 1. As was discussed before, materials used during semiconductor processing are removed through a variety of processes, and the first step and the substrate must share resistance to at least one method of removal.

The third step 13 of the alternative embodiment of FIG. 2 is depositing a sacrificial layer along the first step and the substrate, the sacrificial layer being removable by the agent to which the first step and the substrate are resistant. The sacrificial layer is preferably composed of an oxide material, however it must be composed of a material that can be removed by the agent to which the first step and the substrate are resistant. In a further embodiment the sacrificial layer is composed of $SiO_2$. The sacrificial layer is of a user definable thickness, but in a preferred embodiment is preferably below the resolution readily attainable by standard photolithogaraphy. The sacrificial layer can be deposited on the structure by any conventional means, but is preferably deposited using a conformal process.

The fourth step 14 of the alternative embodiment is depositing a second step on a user-definable portion of sacrificial layer covering the top surface of the first step that is resistant to removal by the same agent as the first step. As was discussed above, the second step is staggered from the first step such that a portion of the first step is visible from at least one side of the second step if a cross section were taken of the structure. The second step may be fabricated of any conventional semiconductor material, electronic component or other suitable material. In a preferred embodiment the second step is composed of a photoresist.

The fifth step 15 of the alternative embodiment is depositing a second layer on the top surfaces of each of a user-definable portion of the sacrificial layer and second step that is resistant to removal by the same agent as the substrate, the first step and the second step. The top surfaces are all the horizontal surfaces of the sacrificial layer and the second step. This second layer may be any suitable semiconductor material, metal or other material that is resistant to the same removal agent as the substrate and at least one step, but is preferably a metal material. The thickness of this second layer is less than the thickness of the first step. In a preferred embodiment the second layer is composed of chromium-gold (Cr—Au) and is deposited by a non-conformal process such as evaporation.

The sixteenth step 16 of the method is removing the second step. Because the second layer is preferably created by a non-conformal process, the sidewalls of the second step are accessible beneath the second layer. The second step, therefore, can be removed without first removing the second layer. Removal of the second step results in removal of the second layer deposited on the second step, leaving the second layer only on the top surface of the sacrificial layer. Any suitable method can be used to remove the second step, such as performing a solvent dissolution.

The seventeenth step 17 of the alternative embodiment is removing a user-definable portion of the sacrificial layer. In the preferred embodiment some of the sacrificial layer will remain after the seventeenth step 17 of the alternative embodiment. This remaining sacrificial layer will adhere the remaining second layer to the substrate. Removal of the sacrificial layer can be performed by any conventional means, but in a preferred embodiment is performed by way of a timed acid etch, or more specifically a timed buffered oxide etch. The result of the removal is that a gap now exists between the second layer adhered to the remaining sacrificial layer on the substrate and the first step.

The eighteenth step 18 of the alternative embodiment is etching the substrate beneath the gap created between the remaining second layer and first step. As was discussed above, a user-definable portion of the sacrificial layer is removed with the remaining sacrificial layer adhering a portion of the remaining second layer to the substrate. The removal of the sacrificial layer creates a gap between the remaining second layer adhered to the substrate and the sidewall of the first step. The substrate is etched through this gap using conventional means, such as the use of an $SF_6/O_2$ plasma etch. The resulting structure can be useful for many applications, such as the creation of Bragg gratings. As was discussed in greater detail above with reference to the method of FIG. 1, as an alternative to etching, material can be deposited into the gap created between the remaining second layer and the first step for a variety of purposes, such as the creation of a quantum wire.

Figure 3:
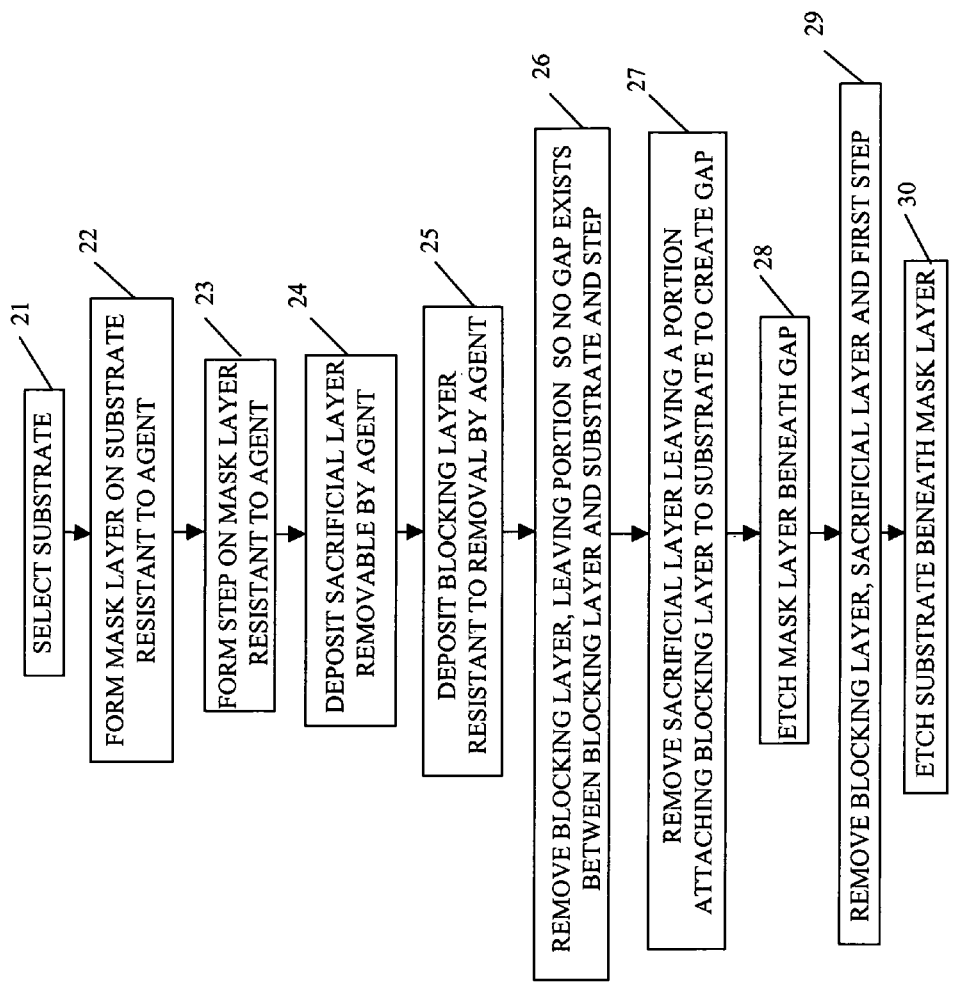
FIG. 3 is a flow chart of the steps of a second alternative embodiment of the present invention.

The steps of a second alternative embodiment are shown in FIG. 3. The first step 21 of the second alternative embodiment is selecting a substrate that is resistant to removal by at least one removal agent. This step is substantially identical to that of the first step of FIG. 1 and the first step of FIG. 2, and therefore will not be described in detail.

The second step 22 of the second alternative embodiment of FIG. 3 is depositing a mask layer on the top surface of the substrate. The mask layer may be composed of any suitable material that can operate as a mask during semiconductor processing, but is preferably composed of a suitable hard mask material. In one preferred embodiment the mask layer is composed of chromium-gold (Cr—Au). The mask layer further may be deposited in any suitable manner, such as sputtering, evaporation, and chemical vapor deposition.

The third step 23 of the second alternative embodiment is forming a first step on the mask layer, wherein the first step and the mask layer are resistant to removal by at least one of the same agents. The first step can be created by any conventional method, such as depositing a material on the mask layer to form the first step. The first step is substantially identical in dimension to that described with respect to the second step 2 of FIG. 1. In the preferred embodiment the first step is composed of a photoresist material, however the first step may be composed of any material suitable for use during semiconductor processing, such as a semiconductor material or electronic component, according to user preferences. As was discussed before, materials used during semiconductor processing are removed through a variety of processes, and the first step and the mask layer must share resistance to at least one method of removal.

The fourth step 24 of the second alternative embodiment of FIG. 3 is depositing a sacrificial layer along the first step and the mask layer, the sacrificial layer being removable by the agent to which the first step and the mask layer is resistant. The sacrificial layer is preferably composed of an oxide material, however it must be composed of a material that can be removed by the agent to which the first step and the mask layer are resistant. In a further embodiment the sacrificial layer is composed of $SiO_2$. The sacrificial layer is of a user definable thickness, but in a preferred embodiment is preferably below the resolution readily attainable by standard photolithography. The sacrificial layer can be deposited on the structure by any conventional means, but is preferably deposited using a conformal process.

The fifth step 25 of the second alternative embodiment is depositing a blocking layer on the sacrificial layer that is resistant to removal by the same agent as the mask layer and the first step. The blocking layer is substantially identical to the blocking layer of the fourth step 4 of the method of FIG. 1, and therefore will not be discussed in detail. In the second alternative embodiment the blocking layer covers the first step and the mask layer.

The sixth step 26 of the second alternative embodiment of FIG. 3 is removing a user-definable portion of the blocking layer, wherein at least a portion of the blocking layer remains adhered to the mask layer such that no gap exists between the sacrificial spacer layer and the blocking layer and wherein the thickness of the remaining blocking layer is user definable. In the preferred embodiment, a sufficient amount of the blocking layer is removed to reveal the sacrificial layer deposited on the upper surface of the first step. The portion of the blocking layer removed should not allow a gap to form between the sacrificial layer covering the first step and the blocking layer. The final blocking layer is preferably of a uniform thickness. This step is substantially identical to that of the fifth step 5 of the method of FIG. 1, and therefore will not be explained in further detail.

The seventh step 27 of the second alternative embodiment of FIG. 3 is removing a user-definable portion of the sacrificial layer, wherein a sufficient amount of the sacrificial spacer layer remains to adhere the remaining blocking layer to the mask layer. In the preferred embodiment some of the sacrificial spacer layer will remain after the seventh step 27 of the method. This remaining sacrificial layer will adhere the remaining sacrificial layer to the mask layer. Removal of the sacrificial layer can be performed by any conventional means, but in a preferred embodiment is performed by way of a timed acid etch, or more specifically a timed buffered oxide etch. The result of the removal is that a gap now exists between the second layer adhered to the substrate and the first step.

The eighth step 28 of the method is etching the mask layer beneath the gap created between the remaining blocking layer and first step such that a gap exists in the mask layer. As was discussed above, a user-definable portion of the sacrificial layer is removed with the remaining sacrificial layer adhering a portion of the remaining blocking layer to the mask layer. The removal of the sacrificial layer creates a gap between the remaining blocking layer adhered to the substrate and the sidewall of the first step. The mask layer is etched through this gap using conventional means, such as the use of ion milling, to create a gap in the mask layer.

The ninth step 29 of the second alternative embodiment is removing the first step, remaining sacrificial layer and blocking layer. This step is optionally performed prior to using the mask layer to perform further etch processes on the underlying substrate. The first step, sacrificial layer and blocking layer can be removed by conventional means. As the blocking layer is attached to the mask layer only by the sacrificial layer it can be simply removed by performing a further acid etch on the sacrificial layer. The acid etch will destroy the sacrificial layer, thus resulting in lift off of the blocking layer. Methods of removal of the step will depend on the material used to create the step. For example if the first step were created from a photoresist material a solvent dissolution process could be used to remove the material.

The tenth step 30 of the second alternative embodiment is etching the mask pattern in the mask layer into the substrate. In the tenth step 30 of the second alternative embodiment the substrate is etched through the gap in the mask layer using conventional processes, such as an $SF_6$ plasma etch process. This allows the mask layer to act as a hard mask in the processing of the underlying substrate. The mask layer can then be removed or remain on the substrate for further semiconductor processing according to user preferences. This second alternative embodiment could be used to precisely form many different mask patterns, which could subsequently be used to etch underlying semiconductor structures, as is obvious to those skilled in the art. As discussed above, an alternative embodiment would be to have material deposited in the mask pattern in the gaps created in the mask layer.

What is claimed is:

1. A method for creating a patterned device comprising the steps of:
   a) selecting a substrate that is resistant to removal by at least one agent;
   b) forming at least one step on the substrate, the at least one step and the substrate having common resistance to removal by at least one agent;
   c) depositing a sacrificial layer along the at least one step and the substrate, the sacrificial layer being removable by an agent to which the at least one step and the substrate share common resistance;
   d) depositing a blocking layer on the sacrificial layer that is resistant to removal by an agent to which the substrate and the at least one step share common resistance;
   e) removing a user-definable portion of the blocking layer, wherein a portion of the blocking layer remains such that no gap exists between the blocking layer and the sacrificial layer and the remaining blocking layer is adhered to the substrate, the thickness of the remaining blocking layer being user-definable;
   f) removing a user-definable portion of the sacrificial layer, wherein a portion of the sacrificial layer remains such that the remaining blocking layer is adhered to the substrate and a gap is created between the remaining blocking layer and the at least one step; and
   g) processing the substrate beneath the gap created between the remaining blocking layer and at least one step adhered to the substrate.

2. The method of claim 1, wherein the step of depositing a sacrificial layer along the at least one step and the substrate, the sacrificial layer being removable by an agent to which the at least one step and the substrate share common resistance further comprises depositing a sacrificial layer along the at least one step and the substrate, the sacrificial layer being removable by an agent to which the at least one step and the substrate share common resistance, wherein the sacrificial spacer layer is composed of an oxide material.

3. The method of claim 2, wherein the step of forming at least one step on the substrate, the at least one step and the substrate having common resistance to removal by at least one agent further comprises forming at least one step on the substrate, the at least one step and the substrate having common resistance to removal by at least one agent, wherein the at least one step comprises a first step projecting from the substrate and a second step projecting from the first step, the second step having a width less than that of the first step and being centered above the first step.

4. The method of claim 3, wherein the step of removing a user-definable portion of the blocking layer, wherein a portion of the blocking layer remains such that no gap exists between the blocking layer and the sacrificial layer and the remaining blocking layer is adhered to the substrate, the thickness of the remaining blocking layer being user-definable further comprises removing a user-definable portion of the blocking layer, wherein a portion of the blocking layer remains such that no gap exists between the blocking layer and the sacrificial layer and the remaining blocking layer is adhered to the substrate, the thickness of the remaining blocking layer being user-definable, wherein the blocking layer is removed by means of a plasma etch process.

5. The method of claim 4, wherein the step of processing the substrate beneath the gap created between the remaining blocking layer and at least one of the step adhered to the substrate further comprises processing the substrate beneath the gap created between the remaining blocking layer and at least one step adhered to the substrate, wherein the processing is performed by a process chosen from the group of processes comprising etching the substrate beneath the gap and depositing material in the gap.

6. The method of claim 5, wherein the step of removing a user-definable portion of the sacrificial layer, wherein a portion of the sacrificial layer remains such that the remaining blocking layer is adhered to the substrate and a gap is created between the remaining blocking layer and the at least one step further comprises removing a user-definable portion of the sacrificial layer, wherein a portion of the sacrificial layer remains such that the remaining blocking layer is adhered to the substrate and a gap is created between the remaining blocking layer and the at least one step, wherein the sacrificial layer is removed by means of a timed etch process.

7. The method of claim 6, wherein the step of removing a user-definable portion of the sacrificial layer, wherein a portion of the sacrificial layer remains such that the remaining blocking layer is adhered to the substrate and a gap is created between the remaining blocking layer and the at least one step further comprises removing a user-definable portion of the sacrificial layer, wherein a portion of the sacrificial layer remains such that the remaining blocking layer is adhered to the substrate and a gap is created between the remaining blocking layer and the at least one step, wherein the sacrificial layer is removed by means of a timed buffered oxide etch process.

* * * * *